United States Patent [19]

Numata et al.

[11] Patent Number: 5,124,594

[45] Date of Patent: Jun. 23, 1992

[54] DIGITAL PHASE COMPARATOR FOR USE IN A PHASE LOCK LOOP

[75] Inventors: Hiroshi Numata, Kanagawa; Tamotsu Kogo, Tokyo; Shinichi Kitazono, Kanagawa; Fumio Ishikawa, Kanagawa; Akira Sato, Kanagawa, all of Japan

[73] Assignee: Sony Corporation, Tokyo, Japan

[21] Appl. No.: 731,322

[22] Filed: Jul. 17, 1991

[30] Foreign Application Priority Data

Jul. 20, 1990 [JP] Japan .................. 2-192194
Jul. 31, 1990 [JP] Japan .................. 2-203093

[51] Int. Cl.$^5$ .................. H03D 13/00; G05B 1/00
[52] U.S. Cl. .................. 307/528; 328/133; 328/134; 340/146.2
[58] Field of Search .............. 328/155, 133, 109, 134, 328/110; 307/262, 528, 290, 289; 342/394, 401; 340/146.2

[56] References Cited

U.S. PATENT DOCUMENTS

| | | | |
|---|---|---|---|
| 3,610,954 | 10/1971 | Treadway | 307/232 |
| 4,179,628 | 12/1979 | Ohgishi et al. | 307/279 |
| 4,322,646 | 3/1982 | Preslar | 307/528 |
| 4,354,124 | 10/1982 | Shima et al. | 328/133 |
| 4,408,165 | 10/1983 | Braun | 307/527 |
| 4,751,469 | 6/1988 | Nakagawa et al. | 328/110 |

Primary Examiner—Stanley D. Miller
Assistant Examiner—Sinh N. Tran
Attorney, Agent, or Firm—Lewis H. Eslinger; Donald S. Dowden

[57] ABSTRACT

A Digital Phase Comparator has a simplified logic circuit in which Nand Circuits provide $\overline{UP}$ and $\overline{DOWN}$ signals containing phase information about $\overline{E}$ and $\overline{F}$ signals.

2 Claims, 12 Drawing Sheets

F I G. 4

A DR | R0 | R1 | R2 | R3 | R4 | R5 | R6 | R7 | R8 | R9 | R10 | R11 | PI3 | PI4 | PI1 | PI2 | A | B | T1 | C (C=L)

B DN | N0 | N1 | N2 | N3 | N4 | N5 | N6 | N7 | N8 | N9 | N10 | N11 | N12 | N13 | N14 | N15 | N16 | N17 | T2 | C (C=H)

F I G. 5

| PI1 | PI2 | PI3 | PI4 | | TRUE DIVIDING NUMBER |
|---|---|---|---|---|---|
| L | H | L | L | RF1U INPUT (PRE-SCALER DIVIDING RATIO : 1/4) | $4 \cdot (N + 8)$ |
| L | H | H | L | RF1U INPUT (PRE-SCALER DIVIDING RATIO : 1/2) | $2 \cdot (N + 8)$ |
| H | H | L | L | RF2V INPUT (PRE-SCALER DIVIDING RATIO : 1/4) | $4 \cdot (N + 8)$ |
| H | H | H | L | RF2V INPUT (PRE-SCALER DIVIDING RATIO : 1/2) | $2 \cdot (N + 8)$ |
| any | H | any | H | RF3F INPUT | $N + 8$ |
| any | L | any | L | RF4A INPUT | $Nm + 2$ |

FIG. 6

| C | CONTENTS OF OPERATION |
|---|---|
| H | INPUT TO DIVIDER 29 |
| L | INPUT TO DIVIDER 40 |

FIG. 7

| T1 | T2 | A | B | AO OUTPUT | BO OUTPUT |
|---|---|---|---|---|---|
| L | L | | | A | B |
| H | L | | | LOCK=H UNLOCK=L | SHIFT REGISTER OUTPUT |
| NORMAL MODE | | | | | |

F I G. 18
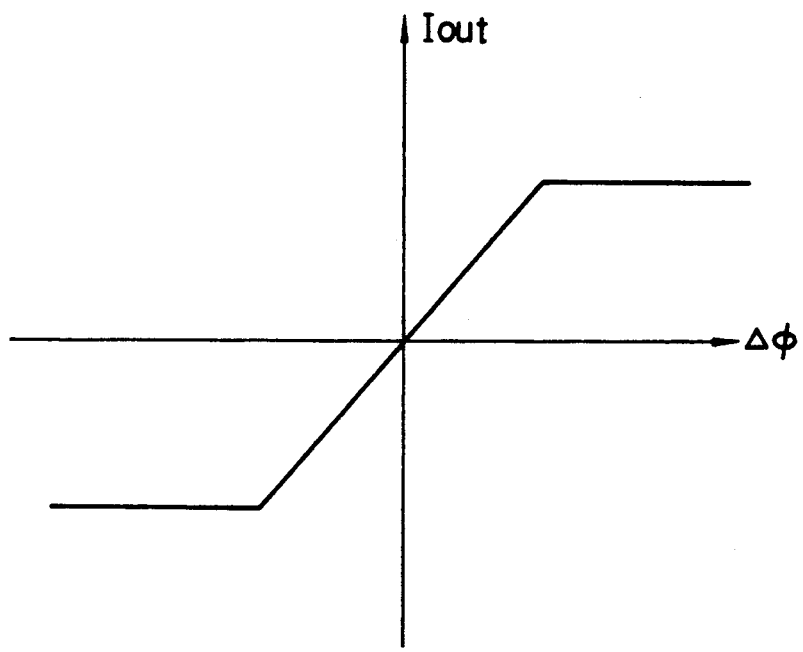

DIGITAL PHASE COMPARATOR FOR USE IN A PHASE LOCK LOOP

BACKGROUND OF THE INVENTION

1. Field of the Invention:

The present invention relates to a phase-locked loop (PLL) apparatus for use with synthesizer tuners containing a pre-scaler arrangement and, more particularly, to a digital type phase comparator which, together with a charge pump circuit and a low-pass filter, constitutes a phase-locked loop system.

2. Description of the Prior Art:

FIG. 1 shows a partial construction of a prior art PLL synthesizer tuner for use with a television set. In the construction of FIG. 1, an RF signal RF1 generated by a local oscillator 1 is supplied via an amplifier 2 to a pre-scaler 3 which is a fixed divider. The pre-scaler 3 divides the RF signal RF 1 by 4. The divided output is sent via the output terminal of the pre-scaler 3 to a phase-locked loop apparatus 4.

There may be assumed a case in which the tuner of the above construction is used to receive, say, channel 4 on the Japanese television frequency VHF band. In that case, the local oscillation frequency is 230 MHz. Dividing that local oscillation frequency by 4 equals 57.5 MHz. This is where one disadvantage of the prior art develops. That is, the signal of the above divided frequency tends to intrude into the intermediate frequency band of 58.75 MHz, causing a beat.

One solution to the unwanted generation of the beat is a method disclosed in Japanese Patent Laid-open No. 57-84629. This method involves equipping the substrate of the apparatus with means to lower the leakage of the signal of the divided frequency.

However, the disclosed method has failed to address drastically the problem of the beat. The need is left unfulfilled for a synthesizer tuner with a phase-locked loop apparatus that would prevent leakage of the signal of the divided frequency into the intermediate frequency band.

There is known a PLL digital type phase comparator that compares a reference pulse signal $\overline{E}$ (called the $\overline{E}$ signal) with a compare pulse signal $\overline{F}$ (called the $\overline{F}$ signal), the $\overline{E}$ and the $\overline{F}$ signals being supplied by a reference signal oscillator and a voltage-controlled oscillator, respectively. Though the compare operation, the phase comparator generates an $\overline{UP}$ signal or a $\overline{DOWN}$ signal and varies it in terms of level.

FIG. 2 depicts the construction of one such prior art digital type phase comparator. This phase comparator comprises six two-input NAND circuits 11 through 16 and three three-input NAND circuits 17 through 19. The $\overline{E}$ signal given to a first input terminal $G_1$ is forwarded to a first two-input NAND circuit 11. The $\overline{F}$ signal given to a second input terminal $G_2$ is sent to a sixth two-input NAND circuit 16. The output of the first two-input NAND circuit 11 is fed to a first and a third three-input NAND circuit 17 and 19 as well as to a second two-input NAND circuit 12. Meanwhile, the output of the sixth two-input NAND circuit 16 is supplied to the second and third three-input NAND circuits 18 and 19 as well as to a fifth two-input NAND circuit 15.

The output of the second two-input NAND circuit 12 is given to the first and third three-input NAND circuits 17 and 19. The second two-input NAND circuit 12 and the third two-input NAND circuit 13 feed back their outputs to each other. Likewise, the fifth two-input NAND circuit 15 and a fourth two-input NAND circuit 14 feed back their outputs to each other. Furthermore, the output of the third three-input NAND circuit 19 is fed to the first and second three-input NAND circuits 17 and 18 as well as to the third and fourth two-input NAND circuits 13 and 14.

The output of the first three-input NAND circuit 17 is output as an $\overline{UP}$ signal to a first output terminal $G_3$ and fed back to the first two-input NAND circuit 11. The output of the second three-input NAND circuit 18 is output as a $\overline{DOWN}$ signal to a second output terminal $G_4$ and fed back to the sixth two-input NAND circuit 16.

As described, the typical prior art phase comparator requires as many as nine NAND circuits: six two-input NAND circuits 11 through 16 and three three-input NAND circuits 17 through 19. In addition, the output of each NAND circuit is fed back to other NAND circuits in a complicated feedback scheme so that the level of the $\overline{UP}$ signal and that of the $\overline{DOWN}$ signal are varied in accordance with the phase status of the input $\overline{E}$ and $\overline{F}$ signals. Thus the prior art phase comparator has a large circuit arrangement that fails sufficiently to meet the need for a smaller comparator size. The complex wiring involved calls for more steps of manufacture, making it difficult to reduce production cost.

OBJECTS AND SUMMARY OF THE INVENTION

It is therefore an object of the present invention to provide a phase-locked loop apparatus for use with a synthesizer tuner, the pre-scaler of the apparatus being serially connected to the programmable divider thereof, the pre-scaler being allowed to select either a first or a second dividing ratio, the dividing ratio of the programmable divider being controlled in accordance with the selected dividing ratio of the pre-scaler.

It is another object of the present invention to provide a phase-locked loop apparatus comprising means for establishing the dividing ratios of the pre-scaler and programmable divider thereof.

It is a further object of the present invention to provide a phase-locked loop apparatus comprising a circuit arrangement for providing feedback to logic circuits constituting a digital type phase comparator. One advantage of this setup is a drastically reduced number of the logic circuits required. The reduced circuit count contributes to simplifying the circuit construction of the digital type phase comparator and to reducing the production cost thereof.

It is yet another object of the present invention to provide a phase-locked loop apparatus comprising an offset removal circuit on the output side of a digital phase comparator so that the phase-locked loop operation is carried out precisely.

BRIEF DESCRIPTION OF THE DRAWINGS

FIG. 4 is a set of views showing structures of data for input to the first embodiment of FIG. 3;

FIG. 5 is a table of receiving frequency bands of a decoder PI versus dividing ratios of a pre-scaler, both parts being included in the first embodiment of FIG. 3;

FIG. 6 is a table of levels of data C versus the contents of control corresponding thereto, the data C being handled by the first embodiment of FIG. 3;

FIG. 7 is a table of levels of data T versus the output states corresponding thereto, the data T being handled by the first embodiment of FIG. 3;

FIG. 18 is a view depicting an input phase versus output current characteristic of the third embodiment of FIG. 15 as it is incorporated in a phase-locked loop

DESCRIPTION OF THE PREFERRED EMBODIMENTS

The first embodiment of the present invention will now be describe with reference to FIGS. 3 through 7.

Figure 3:
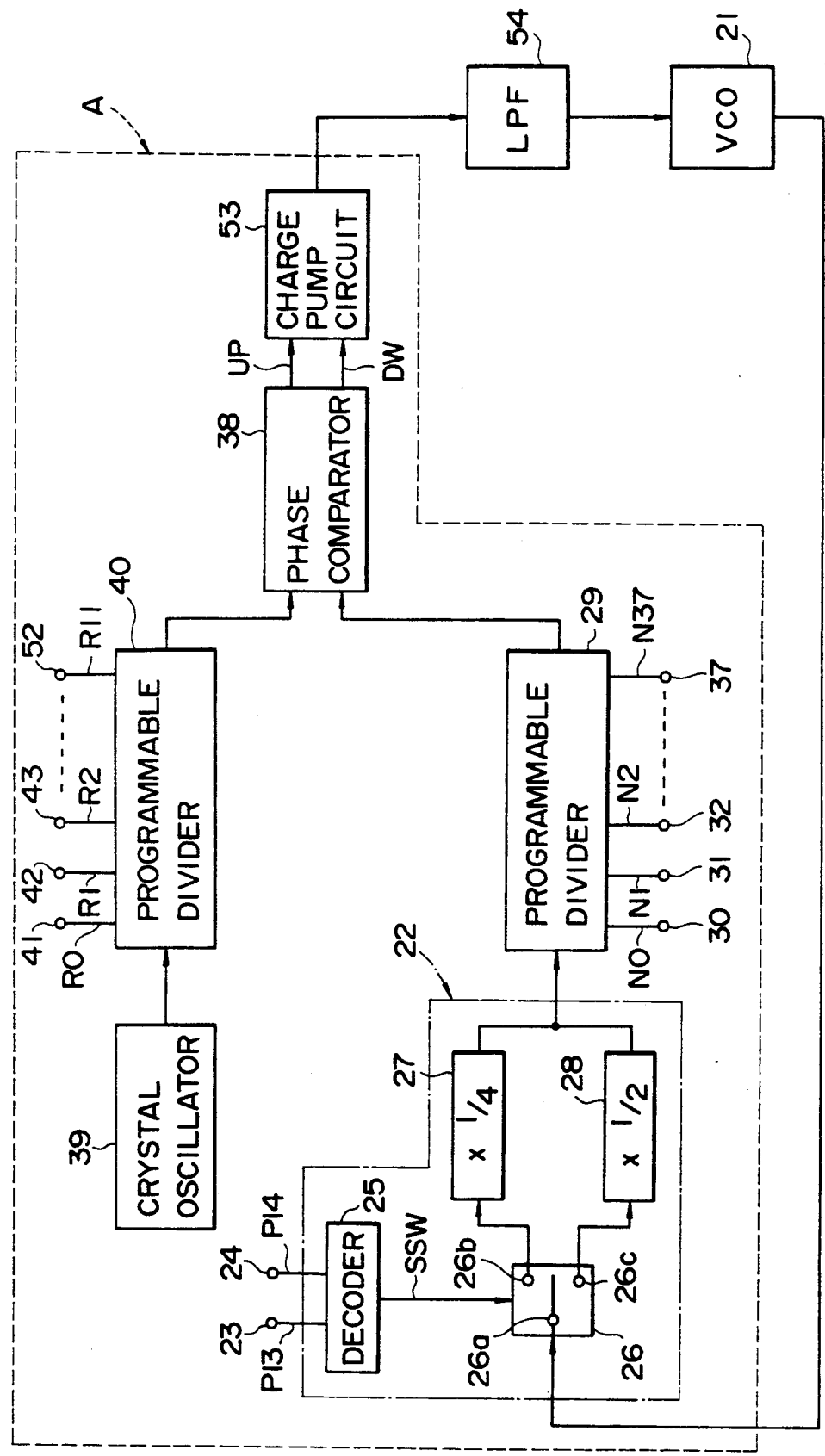
FIG. 3 is a block diagram of a phase-locked loop apparatus for use with synthesizer tuners, the apparatus being practiced as a first embodiment of the present invention.

Referring to FIG. 3, the signal generated by a voltage-controlled oscillator (VCO) 21 is supplied to a prescaler 22. The pre-scaler 22 comprises a decoder 25, a switch 26, and dividers 27 and 28. The decoder 25 generates a switch control signal SSW on the basis of data items PI3 and PI4 supplied through terminals 23 and 24. The switch 26 is controlled in terms of its connecting state by the switch control signal SSW. The dividers 27 and 28 have dividing ratios of ¼ and ½, respectively. The pre-scaler 22 divides the signal from the VCO 21 by 4 or by 2 in terms of frequency, the frequency-divided signal being supplied to a programmable divider 29.

The programmable divider 29 comprises a dual modulus arrangement, a swallow counter and a main divider, not shown. The dividing ratio of the divider 29 is determined by data items N0 through N17 which are contained in the data DN of FIG. 4 (B) and supplied via terminals 30 through 37.

If the dividing ratio of the pre-scaler 22 is ½, the frequency of the programmable divider 29 is doubled. That is, the combined dividing ratio of the pre-scaler 22 and programmable divider 29 in the case above is made equivalent to the dividing ration of ¼ for the pre-scaler 22. In this specification, the denominator of each dividing ratio is called a dividing number.

The signal divided by the programmable divider 29 is supplied to a phase comparator 38. Meanwhile, a reference signal generating circuit 39 comprises a crystal oscillator that generates a reference signal with a frequency of 4 MHz. The reference signal is fed to a programmable divider 40.

The programmable divider 40 is illustratively constituted by a main divider made of a T flip-flop arrangement. The dividing ratio of the divider 40 is determined by data items R0 through R11 which are contained in the data DR of FIG. 4 (A) and supplied via terminals 41 through 52. The reference signal divided by the programmable divider 40 and having a frequency of, say, 6.25 MHz is supplied to the phase comparator 38.

The phase comparator 38 compares the signal from the programmable divider 29 with the reference signal from the programmable divider 40. As a result of this, the phase comparator 38 supplies an UP signal (for advance in phase) or a DOWN signal (for lag in phase) to a charge pump circuit 53.

Given the UP or DOWN signal, the charge pump circuit 53 and a low-pass filter 54 convert to a DC voltage the phase difference represented by that signal. The DC voltage is fed to the voltage-controlled oscillator 21.

Figure 1:
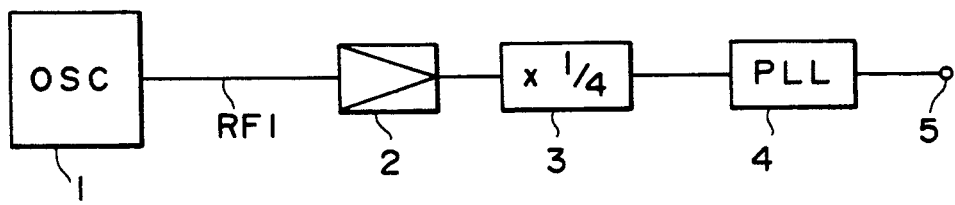
FIG. 1 is a block diagram of a prior art phase-locked loop apparatus for use with synthesizer tuners and containing a pre-scaler.
Figure 2:
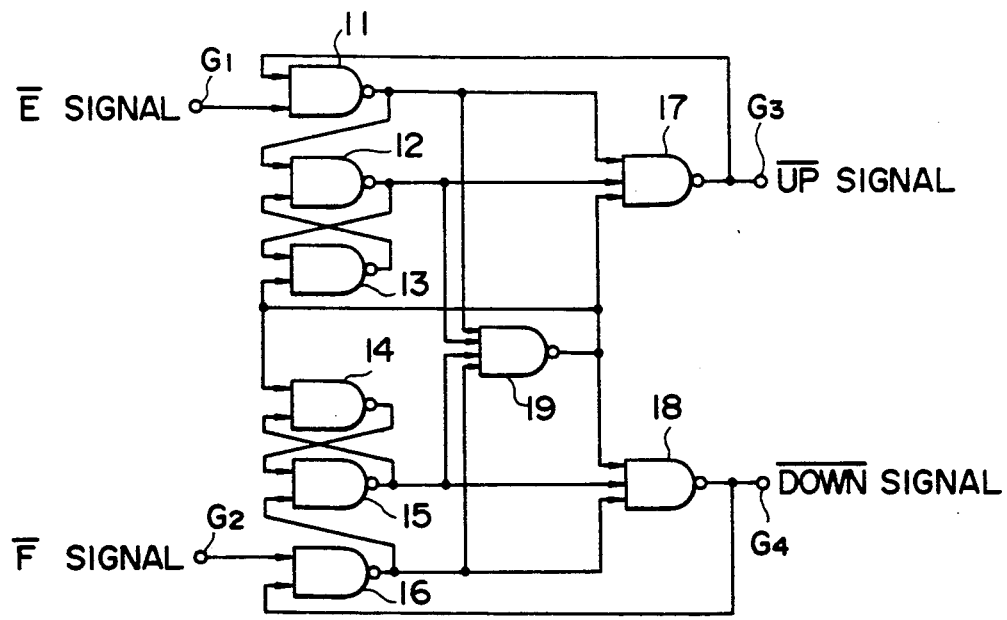
FIG. 2 is a circuit diagram of a prior art phase detector for use with the conventional phase-locked loop apparatus.

In turn, the voltage-controlled oscillator 21 generates a signal whose frequency corresponds to the level of the DC voltage received. This signal is supplied to the pre-scaler 22. In FIG. 1, those parts that are surrounded by broken line A may be manufactured in an IC format.

How the first embodiment works will now be described in detail with reference to FIGS. 3 through 7. Initialization of each circuit block will be described first.

The data DR of FIG. 4 (A) and the data DN of FIG. 4 (B) are composed of 20 bits each. The data DN and DR are fed to latch circuits and latched thereby under control of a controller, not shown.

Of the data DN and DR, data items T1 and T2 are an IC evaluation code each. As shown in FIG. 6, the data item C is a control code that controls the input of data items R0 through R11 and N0 through N17 into the programmable dividers 29 and 40.

Of the data DR in FIG. 4 (A), 12-bit data R0 through R11 are supplied via the terminals 41 through 52 to the programmable divider 40. Under control of a controller, not shown, the 12-bit data R0 through R11 are serially input to the programmable divider 40 when the data item C is at the low level, as shown in FIGS. 3 and 6. The programmable divider 40 determines its dividing ratio based on the 12-bit data R0 through R11.

Of the data DN in FIG. 4 (B), 18-bit data N0 through N17 are supplied via the terminals 30 through 37 to the programmable divider 29. Likewise under control of a controller, not shown, the 18-bit data N0 through N17 are serially input to the programmable divider 29 when the data item C is at the high level, as shown in FIGS. 3 and 6. The programmable divider 29 determines its dividing ratio based on the 18-bit data N0 through N17.

As depicted in FIG. 5, the combination of levels for data items PI1 through PI4 determines what kind of reference signal is to be selected upon receipt. With one combination in which the data item PI1 is Low and the data item PI2 High, a reference signal RF1U for the UHF band is selected. With another combination in which the data item PI1 is High and the data item PI2 also High, a reference signal RF2V for the VHF band is selected.

With yet another combination in which the data item PI1 is at any level and the data item PI2 is High, a reference signal RF3F for the FM broadcast is selected. With a further combination in which the data item PI1 is at any level and the data item PI2 is Low, a reference signal RF4A for the AM broadcast is selected.

As shown in FIG. 5, the combination of levels for the data items PI1 through PI4 determines a true dividing number (the dividing number corresponding to the frequency of each of the reference signals RF1U through RF4A that are input). In FIG. 5, N stands for the dividing number determined by the data items N0 through N17, and Nm represents the dividing number determined by the codes N2 through N17. The true dividing number of the programmable divider 40 is given by (Rr+2), where Rr is the dividing number of the programmable divider 40 represented by the codes R0 through R11. The number "8" in parentheses of FIG. 5 is an offset.

The data items PI3 and PI4 shown in FIG. 3 are used to determine the dividing ratio of the pre-scaler 2. The combination of levels for the data items PI3 and PI4 controls the connecting state of the switch 26. That is, if both data items PI3 and PI4 are Low, then terminals 26a and 26b of the switch 26 are connected, the divider 27 is selected, and the dividing ratio of ¼ is selected for the pre-scaler 22. If the data item PI3 is High and the data item PI4 Low, then the terminal 26a and a terminal 26c are connected in the switch 26, the divider 28 is selected, and the dividing ratio of ½ is selected for the pre-scaler 22.

As depicted in FIG. 7, the combination of levels for data items T1 and T2 controls the supply of switching signals A0 and B0 for band switching. That is, if both data items T1 and T2 are Low, the A0 output is A and the B0 output is B. If the data item T1 is High and the data item T2 Low, the A0 output is locked when High and unlocked when Low; and the B0 output is a shift register output.

When channel 4 on the VHF band is to be received, the data items PI1, PI2 and PI3 are brought High and the data item PI4 is brought Low. This causes the decoder 25 to supply the switch control signal SSW at its high level to the switch 26, connecting the terminals 26a and 26c of the latter.

Thereafter, the signal generated by the voltage-controlled oscillator 21 is sent via the switch 26 to the divider 28 of the pre-scaler 22. The divider 28 divides he signal from the VCO 21 by 2 and supplies the divided signal to the programmable divider 29.

The intrinsic dividing ratio of the pre-scaler 22 is ¼, and the dividing ratio of the pre-scaler 22 at this time is ½. The difference between the two dividing ratios is addressed by doubling the dividing number for the programmable divider 29 through the use of the 18-bit data N0 through N17 of the data DN. Where channel 4 is to be received on the VHF band, the combined dividing ratio of the pre-scaler 22 and programmable divider 29 is made equivalent to the dividing ratio of ¼ for the pre-scaler 22.

The signal divided by 2 by the pre-scaler 22 is further divided by the programmable divider 29. The resulting signal is supplied to the phase comparator 38.

The phase comparator 38 compares in phase the reference signal from the programmable divider 40 and the signal from the programmable divider 29. An advance in phase is represented by an UP signal and a lag in phase by a DOWN signal. Either signal is supplied to the charge pump circuit 53.

In turn, the charge pump circuit 53 and low-pass filter 54 convert the UP or DOWN signal, i.e., the phase difference, to a DC voltage. After the conversion, the DC voltage is fed to the voltage-controlled oscillator 21.

Upon receipt of the DC voltage, the voltage-controlled oscillator 21 generates a signal whose frequency corresponds to the DC voltage. That signal is fed to the pre-scaler 22.

Where a channel other than channel 4 is to be received on the VHF band, the data items PI1 and PI2 are brought High and the data items PI3 and PI4 brought Low. This causes the decoder 25 to supply illustratively the switch control signal SSW at its low level to the switch 26, connecting the terminals 26a and 26b in the latter.

The above operation causes the divider 27 to be selected in the pre-scaler 22. The divider 27 in turn divides by 4 the signal from the voltage-controlled oscillator 21. The divided signal is supplied to the programmable divider 29.

At this point, the dividing ratio of the pre-scaler 22 is ¼. In this case, unlike the case described above, the dividing number for the programmable divider 29 will not be doubled. The other aspects of the operation involved are the same as in the previous case and will not be repeated herein.

According to the first embodiment described above, the dividing ratio of the pre-scaler 22 acting as a fixed divider may be changed to ½ when channel 4 on the VHF band is received. This prevents leaking of the signal with the divided frequency into the intermediate frequency band, thereby suppressing the beat that would otherwise develop upon receipt of that channel. When the dividing ratio of the pre-scaler 22 is set for ½, the pre-scaler 22 has its dividing ratio effectively doubled. This shortens the lock-in time involved.

Although the first embodiment has been described as receiving channel 4 on the VHF band, such operation is not limitative of the embodiment or the invention. As shown in FIG. 5, when the embodiment receives a station on the UHF band, the dividing ratio of the pre-scaler can also be changed to ½.

In the first embodiment of FIG. 3, the signals from the programmable dividers 29 and 40 are input to the phase comparator 38. In turn, the phase comparator 38 detects the phase difference between the two signals, and supplies the charge pump circuit 53 with a phase difference signal representing that difference. Described below with reference to FIG. 8 is a novel phase comparator embodying the present invention.

Figure 8:
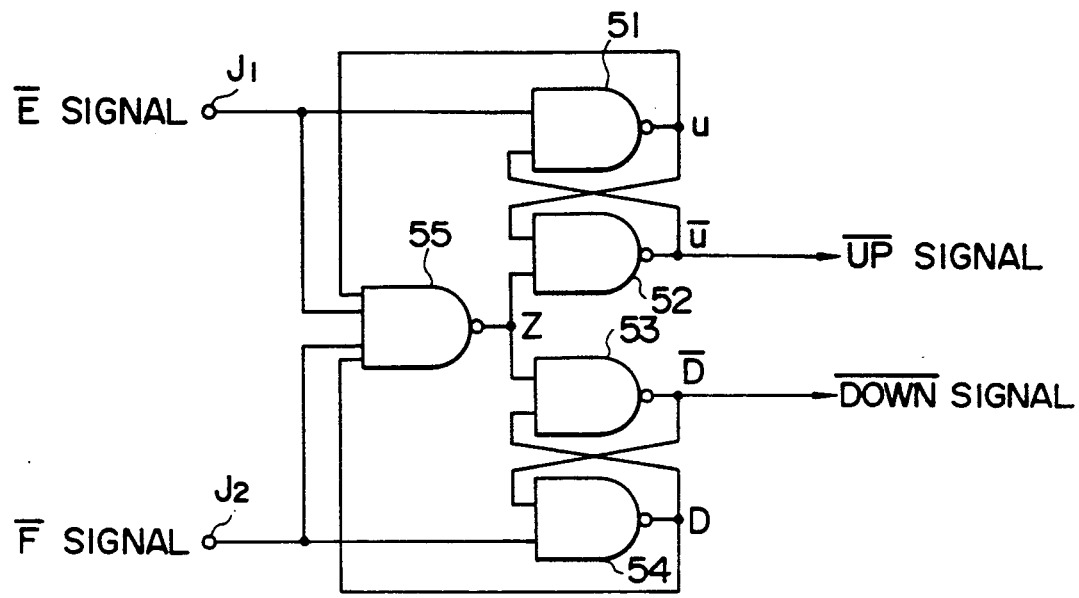
FIG. 8 is a circuit diagram of a digital type phase comparator for use with a phase-locked loop apparatus for synthesizer tuners, the phase comparator being practiced as a second embodiment of the present invention.
Figure 9:
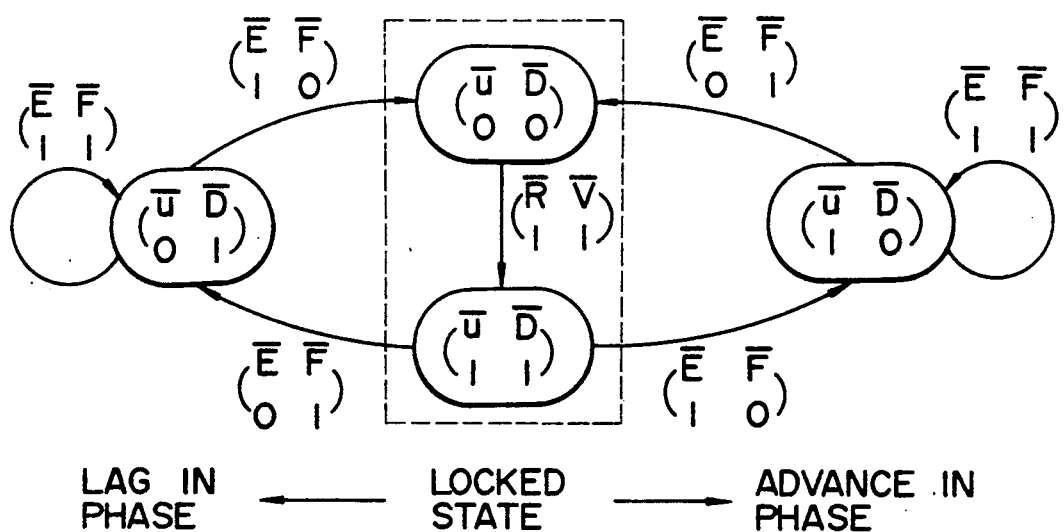
FIG. 9 is a state transition diagram showing how the circuits of the digital type phase comparator as the second embodiment of FIG. 8 operate.

FIG. 8 is a block diagram of the digital type phase comparator practiced as the second embodiment of the invention. FIG. 9 is a state transition diagram depicting how the embodiment of FIG. 8 operates.

As shown in FIG. 8, the digital type phase comparator of FIG. 8 comprises five NAND circuits 51 through 55. Of these NAND circuits the first through the fourth circuits 51-54 are two-input NAND circuits, and the fifth circuit 55 is a four-input NAND circuit.

An $\overline{E}$ signal supplied to a first input terminal $J_1$ is sent to the first NAND circuit 51 as well as to the fifth NAND circuit 55. An $\overline{F}$ signal fed to a second input terminal $J_2$ is supplied to the fourth and the fifth NAND circuits 54 and 55. The output signal u of the first NAND signal 51 is given to the second and the fifth NAND circuits 52 and 55. The output signal D of the fourth NAND circuit 54 is sent to the third and the fifth NAND circuits 53 and 55. Meanwhile, the output signal Z of the fifth NAND circuit 55 is supplied to the second and the third NAND circuits 52 and 53.

The second NAND circuit 52 varies the level of the output $\overline{u}$ signal in accordance with the level of the Z signal from the fifth NAND circuit 55 and with the level of the u signal from the first NAND circuit 51. Varied in its level, the $\overline{u}$ signal is then sent as an $\overline{UP}$ signal out of the phase comparator while also being fed back to the first NAND circuit 51.

The third NAND circuit 53 varies the level of the output $\overline{D}$ signal in accordance with the level of the Z signal from the fifth NAND circuit 55 and with the level of the D signal from the fourth NAND circuit 54. The level-varied $\overline{D}$ signal is sent as a $\overline{DOWN}$ signal outside the phase comparator and also fed back to the fourth NAND circuit 54.

The digital type phase comparator of the above construction operates as depicted in FIG. 9. This state transition diagram shows that as the input ($\overline{E}$, $\overline{F}$) is varied for a given output state ($\overline{u}$, $\overline{D}$), that output state ($\overline{u}$, $\overline{D}$) shifts to the next state. In this case, a locked state occurs when the output state ($\overline{u}$, $\overline{D}$) shifts from (0, 0) to (1, 1). The state of (0, 0) is a lock completed state, and that of (1, 1) is a lock stabilized state. This means that the phase comparator starts operating from the state in which both the input ($\overline{E}$, $\overline{F}$) and the output ($\overline{u}$, $\overline{D}$) are (1, 1) each. For a lag in phase, $\overline{E}=0$ in the input and $\overline{u}=0$ in the output; for an advance in phase, $\overline{F}=0$ in the input and $\overline{D}=0$ in the output.

As described, the phase-locked state of this phase comparator is one in which $u=1$ and $D=1$. This phase-locked state is shifted after passing through a state in which $u=0$ and $D=0$.

How this phase-locked state is attained will now be described for an advance-in-phase state, a lag-in-phase state and an in-phase state with reference to the waveform diagrams of FIGS. 10 through 12.

Figure 10:
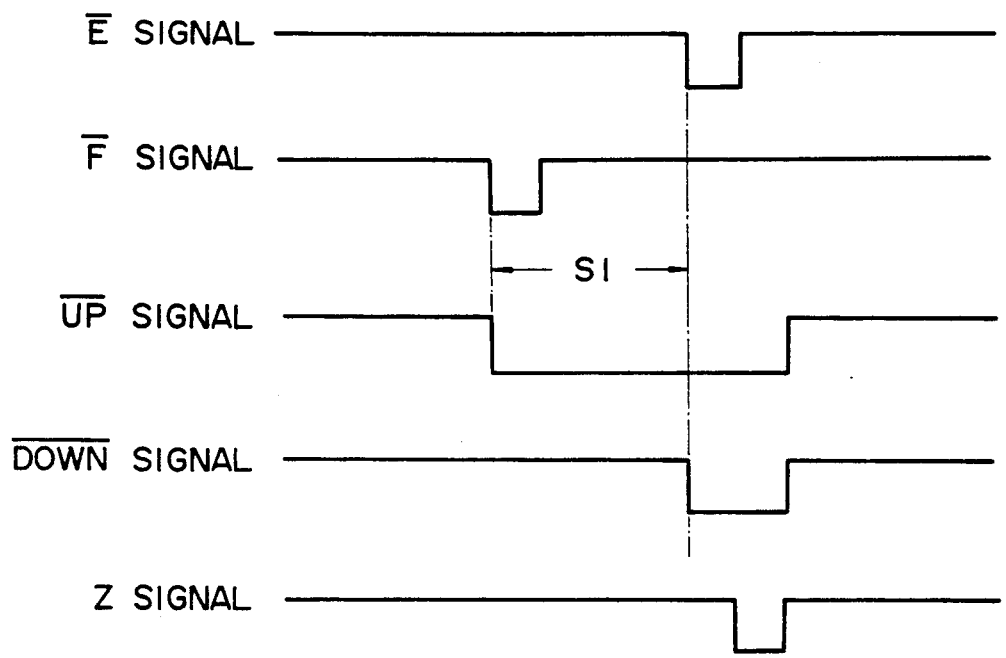
FIG. 10 is a waveform diagram depicting how the second embodiment of FIG. 8 advances in phase.

FIG. 10 illustrates the waveforms of the signals involved for an advance in phase. As depicted, when the $\overline{F}$ signal is set to 0, the $\overline{UP}$ signal is inverted from 1 to 0. When the $\overline{E}$ signal is set to 0, the $\overline{DOWN}$ signal is inverted likewise from 1 to 0. That is, in an advance-in-phase period S1 from the time the $\overline{F}$ signal is set to 0 until the time the $\overline{E}$ signal is set to 0, only the $\overline{UP}$ signal is 0. Thus it is possible to detect and synchronize the phase state on the basis of the logic levels of the $\overline{UP}$ and $\overline{DOWN}$ signals.

When both the $\overline{UP}$ signal and the $\overline{DOWN}$ signal are set to 0, the $\overline{UP}$ signal from the first NAND circuit 51 and the D signal from the fourth NAND circuit 54 are both set to 1. In turn, the fifth NAND circuit 55 has the level of two of its four input signals set to 1. That is, when the level of the other two input signals ($\overline{E}$ and $\overline{F}$ signals) to the NAND circuit 55 is set to 1, all four inputs to the fifth NAND circuit 55 are set to 1. That brings to 0 the Z signal output by the fifth NAND circuit 55.

The Z signal at the 0 level is supplied to the second and third NAND circuits 52 and 53. That brings to 1 the level of the $\overline{u}$ and $\overline{D}$ signals output by the NAND circuits 52 and 53, i.e., the $\overline{UP}$ and $\overline{DOWN}$ signals. As show in FIG. 9, this is where the phase comparator enters its locked state.

Figure 11:
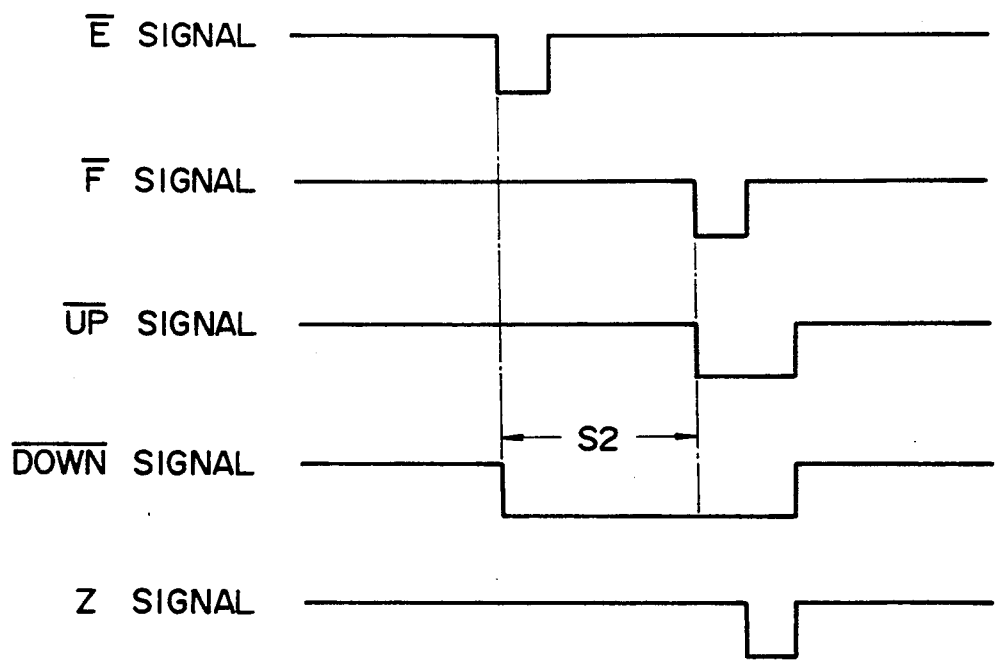
FIG. 11 is a waveform diagram illustrating how the second embodiment of FIG. 8 lags in phase.

As depicted in FIG. 11, a lag-in-phase state involves having only the $\overline{DOWN}$ signal set to 0 during a lag-in-phase period S2, as opposed to the $\overline{UP}$ signal being set to 0 in the advance-in-phase state. In that case, it is also possible to detect and synchronize the phase state on the basis of the levels of the $\overline{UP}$ and $\overline{DOWN}$ signals.

How the phase comparator operates in an in-phase state will now be described with reference to FIG. 12. When the $\overline{E}$ and $\overline{F}$ signals are in phase with each other, there is neither the advance-in-phase period S1 nor the lag-in-phase period S2 involved. There is no possibility of either the $\overline{UP}$ signal or the $\overline{DOWN}$ signal being set to 0. That is, if both the $\overline{UP}$ signal and the $\overline{DOWN}$ signal are found to be set to 1, the synchronization of the two signals is confirmed.

As described, the digital type phase comparator practiced as the second embodiment precisely compares the $\overline{E}$ and $\overline{F}$ signals in terms of phase despite its simplified structure comprising only five NAND circuits.

How the second embodiment works will now be described in more detail by referring primarily to FIG. 13 and 14.

Figure 13:
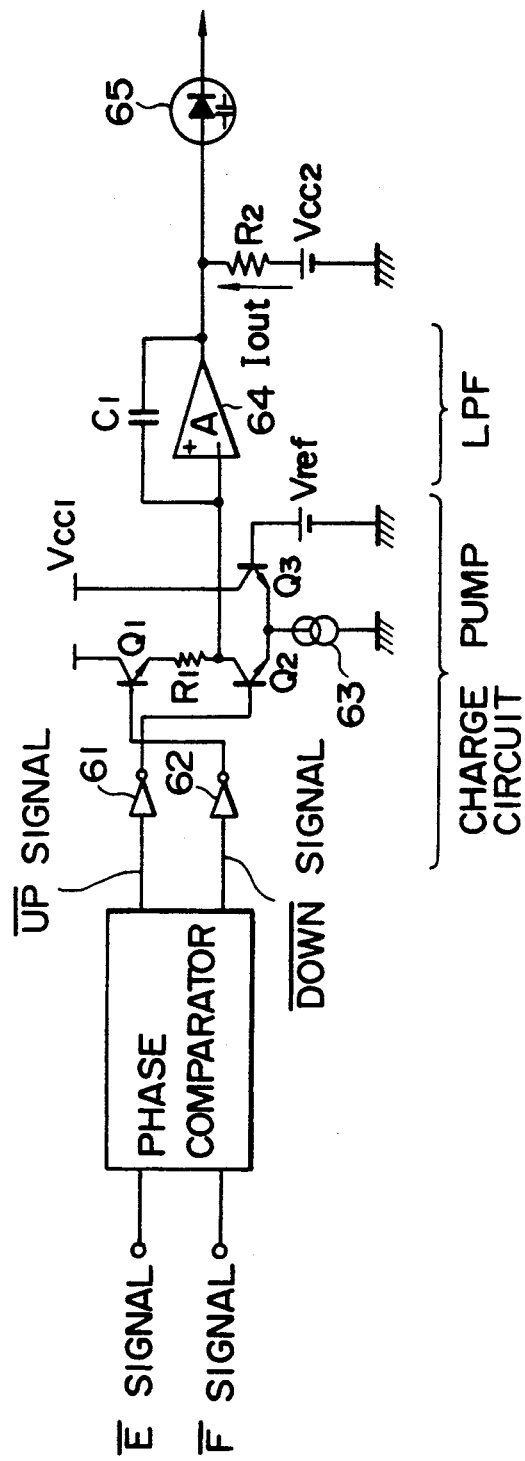
FIG. 13 is a circuit diagram of a phase-locked loop system utilizing the second embodiment of FIG. 8.
Figure 14:
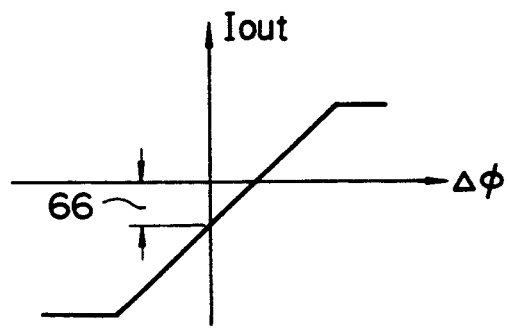
FIG. 14 is a view describing a phase versus output current characteristic (offset) of the phase-locked loop system of FIG. 13 as it operates for input and output.

The digital type phase comparator in the first embodiment of FIG. 8 constitutes a phase-locked loop system when provided on its output side with a charge pump circuit, a low-pass filter LPF and other circuits, as illustrated in FIG. 13. Referring to FIG. 13, the $\overline{UP}$ signal is sent via a first inverter 61 to the base of a second npn transistor $Q_2$. The $\overline{DOWN}$ signal is supplied via a second inverter 62 to the base of a first npn transistor $Q_1$. The collector of the first npn transistor $Q_1$ is connected to a first power source $V_{cc1}$. A first resistor $R_1$ is interposingly connected between the first and the second npn transistors $Q_1$ and $Q_2$. The emitter of the second npn transistor $Q_2$ is connected to ground via a constant current source 63. The emitter of a third npn transistor $Q_3$, the base of which is fed with a reference voltage Vref, is connected to ground also via the constant current source 63 which is shared by the emitter of the second npn transistor $Q_2$.

The collector of the second npn transistor $Q_2$ is connected to the inverted input terminal of an amplifier 64 that constitutes the low-pass filter LPF. The output of the amplifier 64 is fed back via a capacitor $C_1$ to the amplifier input side. Between the output side of the amplifier 64 and ground are interposed a second resistor $R_2$ and a second power source $V_{cc2}$. The voltage of the second resistor $R_2$ is supplied to a variable capacitor 65 which detects changes in the output voltage as changes in frequency.

In the phase-locked loop system of the above-described construction, the first npn transistor $Q_1$ is turned off and the second npn transistor $Q_2$ turned on when the $\overline{UP}$ signal is 0 and the $\overline{DOWN}$ signal is 1, i.e., in the advance-in-phase state depicted in FIG. 10. In this case, a current flows from the amplifier 64 to the collector of the second npn transistor $Q_2$, causing a current $I_{out}$ to flow into the second resistor $R_2$. Because there occurs a drop in the output voltage taken from one end of the second resistor $R_2$ and given to the variable capacitor 65, the oscillation frequency of the voltage-controlled oscillator is lowered.

When the $\overline{UP}$ signal is 1 and the $\overline{DOWN}$ signal is 0, i.e., in the lag-in-phase state of FIG. 11, the first npn transistor $Q_1$ is turned on and the second npn transistor $Q_2$ turned off. In this case, a current flows from the emitter of the first npn transistor Q₁ to the amplifier 64, raising the potential of the second resistor R₂. Thus an increase occurs in the voltage applied to the variable capacitor 65 in the lag-in-phase state, which raises the oscillation frequency of the voltage-controlled oscillator.

Figure 12:
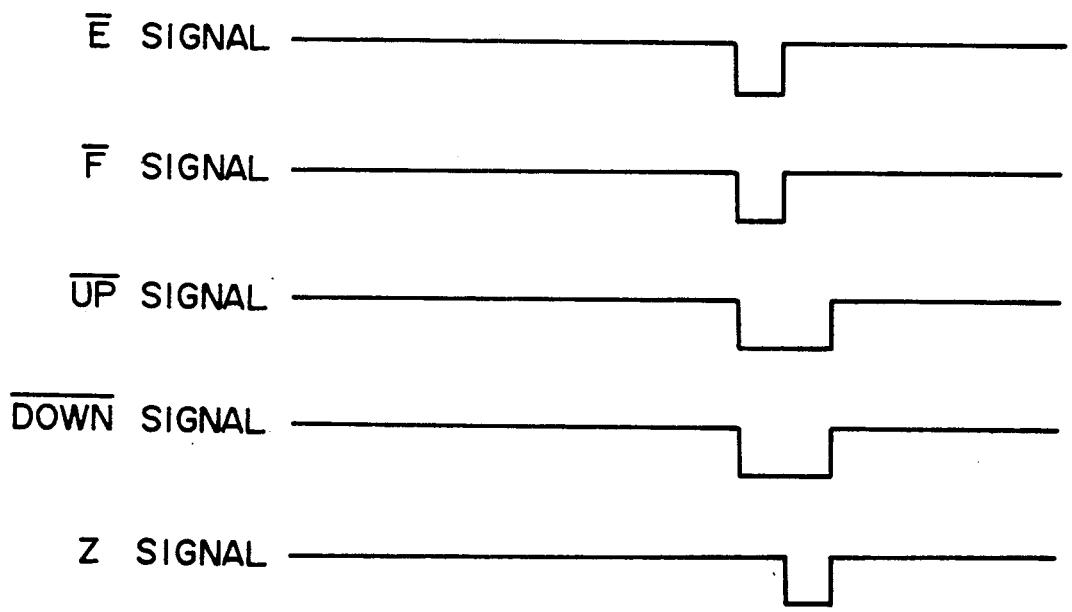
FIG. 12 is a waveform diagram showing how the second embodiment of FIG. 8 synchronizes in phase.

As shown in FIG. 12, the in-phase state involves neither advance nor lag in phase to be represented by the $\overline{UP}$ or $\overline{DOWN}$ signal. The two signals are set to 1 each, and the first and second transistors Q₁ and Q₂ remain inactive. In this case, the output terminal of the charge pump circuit is held at the high impedance level. In turn, the potential of the second resistor R₂ is stabilized and the in-phase state is maintained.

As described, the phase-locked loop system of FIG. 13 is constructed in such a manner that when both the $\overline{UP}$ and the $\overline{DOWN}$ signals are set to 1, the first and second npn transistors Q₁ and Q₂ are turned off and the voltage applied to the variable capacitor 65 is stabilized. However, this system may develop a malfunction when both the $\overline{UP}$ and the $\overline{DOWN}$ signals are set to 0. That is, when the $\overline{UP}$ and the $\overline{DOWN}$ signals are set to 0 and the first and the second transistors Q₁ and Q₂ are turned on, the electric charge accumulated in the capacitor C₁ of the low-pass filter LPF is forcibly released. As a result, as illustrated in FIG. 14, an output current I_out flows into the second resistor R₂ and an offset 66 occurs despite the absence of a phase difference ΔΦ between the $\overline{E}$ and the $\overline{F}$ signals which have been input.

With the digital type phase comparator of FIG. 8, both the $\overline{UP}$ and the $\overline{DOWN}$ signals may be set momentarily to 0 at the same time, which inevitably causes the offset 66. Although the offset 66 does not disrupt the general use of the phase comparator, it does adversely affect some applications in which frequency needs to be controlled with precision.

Figure 15:
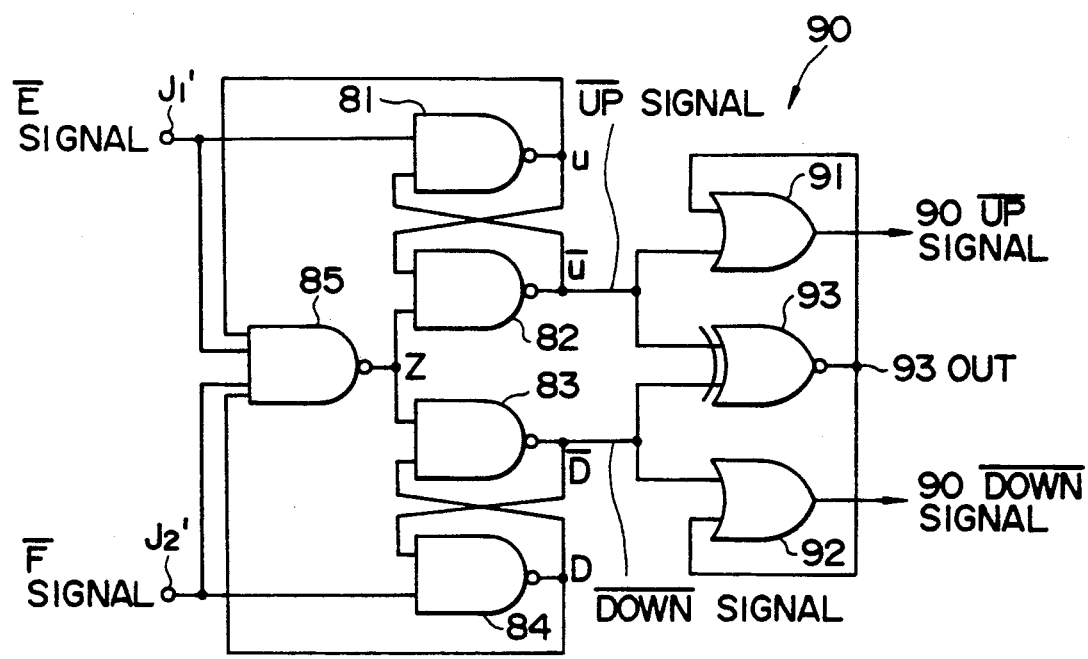
FIG. 15 is a circuit diagram of a digital type phase comparator practiced as a third embodiment of the present invention.

Described below with reference to FIG. 15 is another digital type phase comparator practiced as the third embodiment of the invention. This embodiment is constructed to suppress the above-mentioned offset 66 of the output current I_out.

As the third embodiment of the invention, this digital type phase comparator is constituted by a digital type phase comparator of FIG. 8 supplemented on its output side with an offset removal circuit 90. The offset removal circuit 90 comprises a first OR circuit 91, a second OR circuit 92 and an exclusive NOR circuit 93. The $\overline{UP}$ signal supplied from the upstream phase comparator is fed to the first OR circuit 91 and the exclusive NOR circuit 93. The $\overline{DOWN}$ signal is supplied to the second OR circuit 92 and the exclusive NOR circuit 93. A 93out signal that is output by the exclusive NOR circuit 93 is given to the first and the second OR circuits 91 and 92.

Figure 16A:
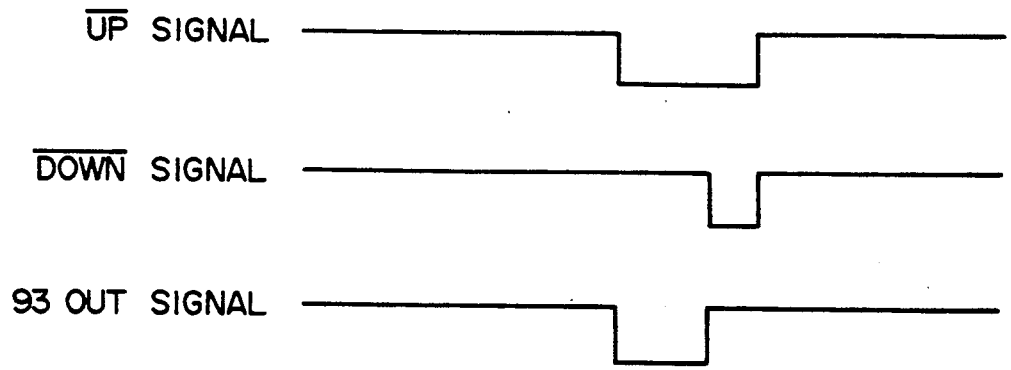
FIGS. 16 (A) through 16 (C) are waveform diagrams of an offset removal circuit operating in the third embodiment of FIG. 15.
Figure 16B:
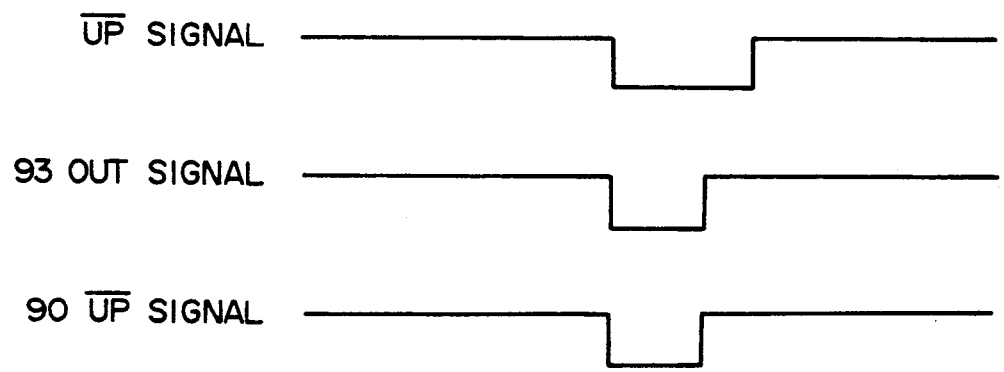
Figure 16C:
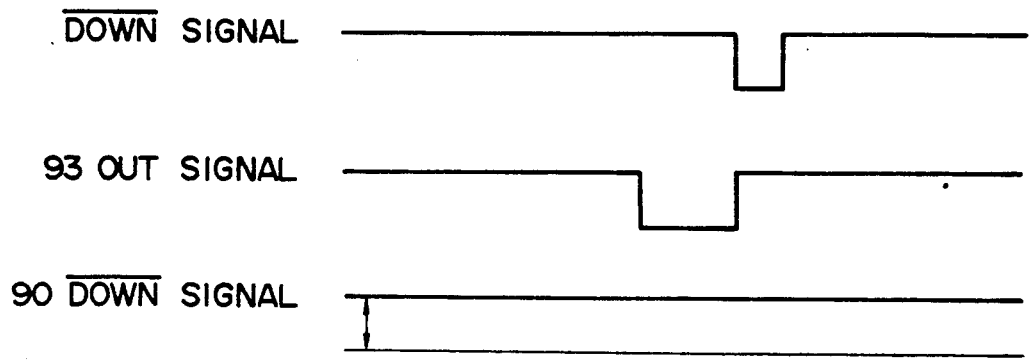

As illustrated in the waveform diagram of FIG. 16 (A), the 93out signal from the exclusive NOR circuit 93 is set to 0 if either the $\overline{UP}$ signal or the $\overline{DOWN}$ signal is 0.

A 90$\overline{up}$ signal from the first OR circuit 91 is set to 0 when both the $\overline{UP}$ signal and the 93out signal are 0, as depicted in FIG. 16 (B). Furthermore, a 90$\overline{down}$ signal from the second OR circuit 92 is always 1 because the $\overline{DOWN}$ signal and the 93out signal are not simultaneously set to 0, as shown in FIG. 16 (C).

As described, the third embodiment comprises the offset removal circuit 90 which converts the $\overline{UP}$ signal from the upstream circuit into the 90$\overline{up}$ signal and the $\overline{DOWN}$ signal into the 90$\overline{down}$ signal, both for output.

Figure 17A:
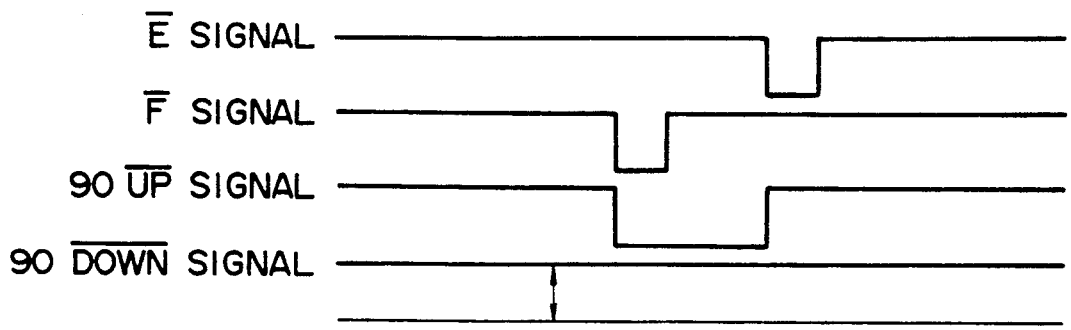
FIGS. 17 (A) through 17 (C) are waveform diagrams of the third embodiment of FIG. 15.
Figure 17B:
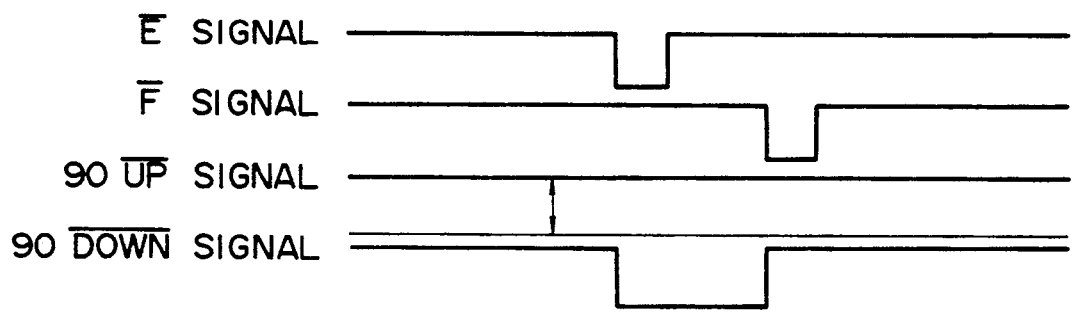
Figure 17C:
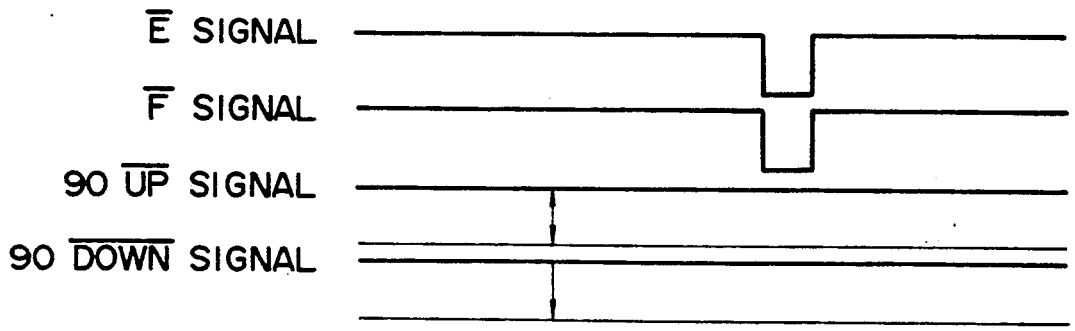

As a result, the digital type phase comparator of FIG. 15 operates as depicted in the waveform diagram of FIGS. 17. In the advance-in-phase state, the 90$\overline{down}$ signal that is an improvement of the $\overline{DOWN}$ signal is always 1, as shown in FIG. 17 (A).

In the lag-in-phase state, as depicted in FIG. 17 (B), the 90$\overline{up}$ signal that is an improvement of the $\overline{UP}$ signal is always 1. Furthermore, in the in-phase state, both the 90$\overline{down}$ signal and the 90$\overline{up}$ signal are always 1. Thus with this digital type phase comparator as the third embodiment of the invention, there is no period in which the two outputs would be simultaneously 0. If the phase-locked loop system of FIG. 13 is constructed using the third embodiment, the output impedance of the charge pump circuit is kept high. This effectively prevents the forced discharge of the capacitor C₁ in the low-pass filter LPF. Therefore, with the two input signals $\overline{E}$ and $\overline{F}$ in phase (i.e., phase difference ΔΦ=0), the output current I_out does not flow, as depicted in the I_out versus ΔΦ characteristic view of FIG. 18. That is, the offset 66 experienced in the second embodiment is now effectively suppressed.

Although the third embodiment has utilized the exclusive NOR circuit 93 in constituting the offset removal circuit 90, an exclusive OR circuit arrangement may be used alternatively.

To sum up, one phase-locked loop apparatus according to the invention selects a dividing ratio of ½ and doubles the dividing number of a downstream programmable divider connected thereto when illustratively receiving channel 4 on the Japanese television VHF band. The combined dividing ratio of a pre-scaler and the programmable divider constituting the phase-locked loop apparatus is made equivalent to a dividing ratio of ¼ for the prescaler. This setup prevents leaking of the signal having the divided frequency into the intermediate frequency band, thereby suppressing the beat that would otherwise occur upon receipt of channel 4 on the VHF band. When the dividing ratio of ½ is selected for the pre-scaler, that ratio is double the ratio of ¼, which provides an additional benefit of shortening the lock-in time involved.

As described, one digital type phase comparator according to the invention and illustratively for use with phase-locked loop synthesizers compares in phase the $\overline{E}$ signal from a reference signal oscillator with the $\overline{F}$ signal from a voltage-controlled oscillator. After comparison, the phase comparator outputs the $\overline{UP}$ or $\overline{DOWN}$ signal with its logic level controlled according to the phase difference between the two input signals. In this phase comparator, the output of one logic circuit is fed back to another logic circuit thereof. This setup simplifies the circuit construction of the digital type phase comparator, reduces its size and lowers its manufacturing cost.

As described, another digital type phase comparator according to the invention is constituted using the above-mentioned phase comparator equipped on its output side with a circuit arrangement that keeps both the $\overline{UP}$ and the $\overline{DOWN}$ signals coming from the phase comparator from getting set to 0 simultaneously. Illustratively, when this digital type phase comparator is used to construct a phase-locked loop system, the output end of a charge pump circuit connected downstream thereto is kept at the high impedance level. This setup effectively prevents any offset from taking place.

As many apparently different embodiments of this invention may be made without departing from the spirit and scope thereof, it is to be understood that the invention is not limited to the specific embodiments thereof except as defined in the appended claims.

What is claimed is:

1. A digital type phase comparator comparing in phase an $\overline{E}$ signal from a reference signal oscillator with an $\overline{F}$ signal from a voltage-controlled oscillator and outputting an $\overline{UP}$ signal or a $\overline{DOWN}$ signal, the logic level of said $\overline{UP}$ signal or said $\overline{DOWN}$ signal being controlled according to the phase difference between said $\overline{E}$ signal and said $\overline{F}$ signal, said digital type phase comparator comprising:

a first NAND circuit to which said $\overline{E}$ signal is supplied;

a fourth NAND circuit to which said $\overline{F}$ signal is supplied;

a second NAND circuit to which the output of said first NAND circuit is supplied and whose output is sent to said first NAND circuit;

a third NAND circuit to which the output of said fourth NAND circuit is supplied and whose output is sent to said fourth NAND circuit; and a fifth NAND circuit to which said $\overline{E}$ signal, said $\overline{F}$ signal, the output of said first NAND circuit and the output of said fourth NAND circuit are supplied;

wherein the output of said fifth NAND circuit is fed to said second NAND circuit and said third NAND circuit; and wherein the output of said second NAND circuit and that of said third NAND circuit are output to the outside as said $\overline{UP}$ signal and said $\overline{DOWN}$ signal containing the phase information about said $\overline{E}$ signal and said $\overline{F}$ signal.

2. A digital type phase comparator comparing in phase an $\overline{E}$ signal from a reference signal oscillator with an $\overline{F}$ signal from a voltage-controlled oscillator and outputting and $\overline{UP}$ signal or a $\overline{DOWN}$ signal, the logic level of said $\overline{UP}$ signal or said $\overline{DOWN}$ signal being controlled according to the phase difference between said $\overline{E}$ signal and said $\overline{F}$ signal, said digital type phase comparator comprising:

a first NAND circuit to which said $\overline{E}$ signal is supplied;

a fourth NAND circuit to which said $\overline{F}$ signal is supplied;

a second NAND circuit to which the output of said first NAND circuit is supplied and whose output is sent to said first NAND circuit;

a third NAND circuit to which the output of said fourth NAND circuit is supplied and whose output is sent to said fourth NAND circuit; and a fifth NAND circuit to which said $\overline{E}$ signal, said $\overline{F}$ signal, the output of said first NAND circuit and the output of said fourth NAND circuit are supplied, wherein the output of said fifth NAND circuit is supplied to said second NAND circuit and to said third NAND circuit;

an upstream circuit for forwarding downstream the output of said second NAND circuit and that of said third NAND circuit as said $\overline{UP}$ signal and said $\overline{DOWN}$ signal containing the phase information about said $\overline{E}$ signal and said $\overline{F}$ signal;

a first logic circuit to which said $\overline{UP}$ signal is supplied;

a second logic circuit to which said $\overline{DOWN}$ signal is supplied; and an exclusive OR or NOR circuit to which said $\overline{UP}$ signal and said $\overline{DOWN}$ signal are supplied;

wherein the output of said exclusive OR or NOR circuit is fed to said first and said second logic circuits and the output of said first logic circuit and that of said second logic circuit are sent out of said phase comparator as an improved $\overline{UP}$ signal and an improved $\overline{DOWN}$ signal, said improved $\overline{UP}$ and $\overline{DOWN}$ signals containing the phase information about said $\overline{E}$ signal and said $\overline{F}$ signal.

* * * * *